United States Patent
Kemmoku

(10) Patent No.: US 8,300,209 B2
(45) Date of Patent: Oct. 30, 2012

(54) EXPOSURE METHOD, EXPOSURE APPARATUS, AND DEVICE MANUFACTURING METHOD

(75) Inventor: Hiromi Kemmoku, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 286 days.

(21) Appl. No.: 12/756,152

(22) Filed: Apr. 7, 2010

(65) Prior Publication Data

US 2010/0259740 A1 Oct. 14, 2010

(30) Foreign Application Priority Data

Apr. 13, 2009 (JP) ................................ 2009-097390

(51) Int. Cl.
*G03B 27/42* (2006.01)
*G03B 27/54* (2006.01)

(52) U.S. Cl. .......................................... 355/53; 355/67

(58) Field of Classification Search .............. 355/52, 355/53, 55, 67–68; 356/399–401; 250/548
See application file for complete search history.

(56) References Cited

U.S. PATENT DOCUMENTS

| | | | |
|---|---|---|---|
| 5,335,044 A | 8/1994 | Shiraishi | |
| 6,534,242 B2* | 3/2003 | Sugita et al. | 430/312 |
| 6,822,728 B2* | 11/2004 | McCullough et al. | 355/53 |
| 7,713,889 B2* | 5/2010 | Hirukawa | 438/800 |
| 2003/0038931 A1 | 2/2003 | Toyoda et al. | |
| 2004/0053148 A1 | 3/2004 | Morohoshi | |
| 2004/0174512 A1 | 9/2004 | Toyoda et al. | |
| 2005/0270608 A1 | 12/2005 | Shiozawa et al. | |

FOREIGN PATENT DOCUMENTS

| | | |
|---|---|---|
| EP | 1953806 A1 | 8/2008 |
| JP | 05-304076 A | 11/1993 |
| JP | 2003-068604 A | 3/2003 |
| JP | 2004-111579 A | 4/2004 |
| JP | 2004-247527 A | 9/2004 |
| JP | 2006-019702 A | 1/2006 |
| JP | 2008108851 A | 5/2008 |
| KR | 20080068820 A | 7/2008 |
| WO | 99/36832 A1 | 7/1999 |

OTHER PUBLICATIONS

Office Action issued in corresponding Japanese Patent Application No. 2009-097390 dated Jan. 14, 2011.
Korean Office Action issued in counterpart application No. KR10-2010-0030705, issued Apr. 20, 2012.

* cited by examiner

*Primary Examiner* — Hung Henry Nguyen
(74) *Attorney, Agent, or Firm* — Rossi, Kimms & McDowell LLP

(57) ABSTRACT

A method for exposing a substrate by an exposure apparatus having an illumination optical system which is configured to illuminate an original and includes an adjusting mechanism that adjusts an effective light source distribution, and a projection optical system which projects a pattern of the original illuminated by the illumination optical system onto a substrate. The method includes steps of obtaining correlation information indicating a correlation between an effective light source distribution and a line width difference in a pattern formed on a substrate by exposure, determining an effective light source distribution corresponding to a target line width difference based on the correlation information, controlling the adjusting mechanism so as to obtain the effective light source distribution determined in the determining step, and exposing the substrate after the controlling step.

9 Claims, 9 Drawing Sheets

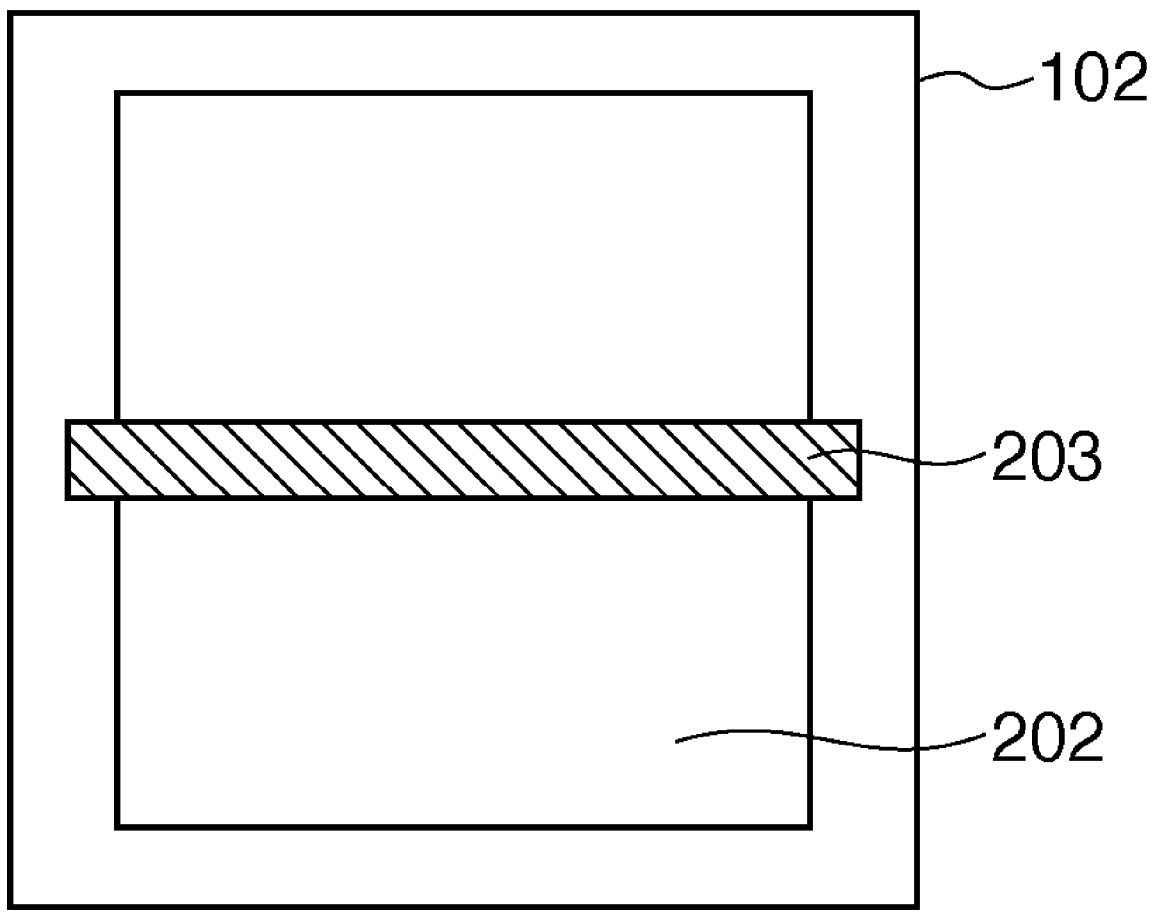

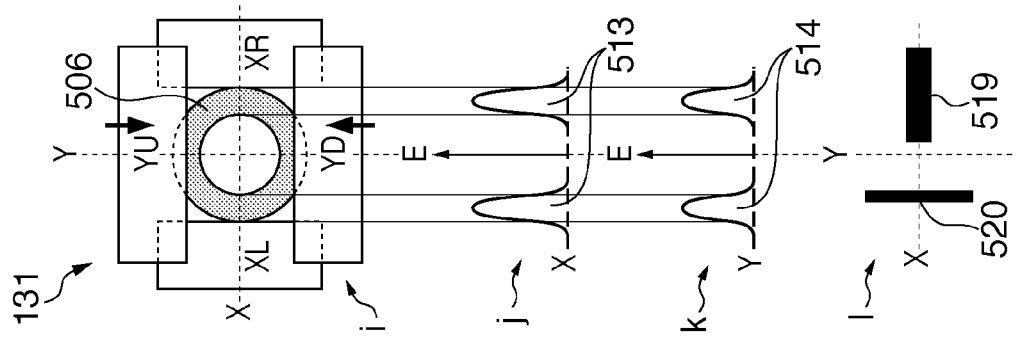
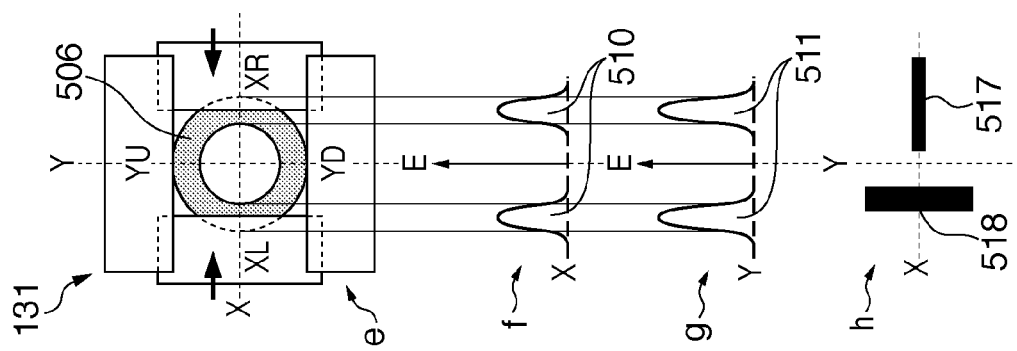
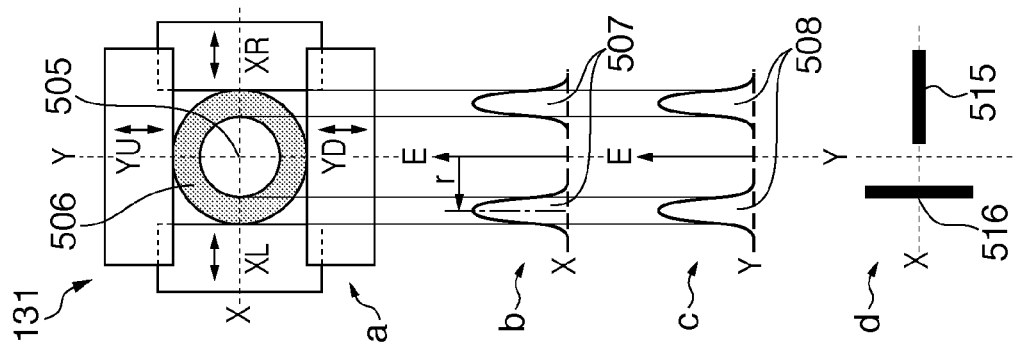

X/Y LIGHT QUANTITY RATIO
WHEN LIGHT-SHIELDING PLATES ARE OPEN

X/Y LIGHT QUANTITY RATIO
AFTER LIGHT-SHIELDING PLATES MOVE

EXPOSURE METHOD, EXPOSURE APPARATUS, AND DEVICE MANUFACTURING METHOD

BACKGROUND OF THE INVENTION

1. Field of the Invention

The present invention relates to an exposure method, an exposure apparatus, and a device manufacturing method.

2. Description of the Related Art

An exposure apparatus is employed to manufacture devices such as a semiconductor device. The exposure apparatus illuminates an original (also called a mask or a reticle) by an illumination optical system, and projects the pattern of the original onto a substrate (for example, a wafer or a glass plate) coated with a photosensitive material by a projection optical system, thereby exposing the substrate. With this operation, a latent image is formed on the photosensitive material and visualizes into a physical pattern by a development process. Oblique-incidence illumination methods for obliquely illuminating the original are known to miniaturize a pattern formed on a substrate. Annular illumination and quadrupole illumination, for example, are known as the oblique-incidence illumination methods. In the annular illumination, an annular light intensity distribution is formed on the pupil plane of the illumination optical system. In the quadrupole illumination, a light intensity distribution with four poles is formed on the pupil plane of the illumination optical system. A light intensity distribution formed on the pupil plane of the illumination optical system is often called an effective light source distribution. Note that the pupil plane of the projection optical system is conjugate to that of the illumination optical system.

In the following description, a direction is defined with reference to an X-Y-Z coordinate system that has its X-Y plane parallel to the substrate plane and has its Z-axis in a direction parallel to the optical axis of the projection optical system. If the distributions, in the X and Y directions, of the effective light source distribution have a difference between them, a difference (line width difference) may occur in line width between a pattern formed to extend in the X direction on a substrate and a pattern formed to extend in the Y direction on the substrate. Japanese Patent Laid-Open Nos. 2004-247527 and 2006-19702 disclose methods of adjusting the effective light source distribution.

Even if the effective light source distribution is ideally adjusted, a line width difference may occur due to factors other than those associated with the exposure apparatus. It is difficult to reduce such a line width difference by eliminating those factors.

SUMMARY OF THE INVENTION

The present invention controls the above-mentioned line width difference by adjusting the effective light source distribution.

One of the aspects of the present invention provides a method for exposing a substrate by an exposure apparatus comprising an illumination optical system which is configured to illuminate an original and includes an adjusting mechanism that adjusts an effective light source distribution, and a projection optical system which projects a pattern of the original illuminated by the illumination optical system onto a substrate, the method comprising the steps of obtaining correlation information indicating a correlation between an effective light source distribution and a line width difference in a pattern formed on a substrate by exposure, determining an effective light source distribution corresponding to a target line width difference based on the correlation information, controlling the adjusting mechanism so as to obtain the effective light source distribution determined in the determining step, and exposing the substrate after the controlling step, wherein the line width difference is a difference in line width between a pattern extending in a first direction within a plane of the substrate and a pattern extending in a second direction perpendicular to the first direction within the plane of the substrate.

Further features of the present invention will become apparent from the following description of exemplary embodiments with reference to the attached drawings.

BRIEF DESCRIPTION OF THE DRAWINGS

FIG. 2 is a view illustrating an original illumination method;

FIGS. 5A to 5C are views each illustrating a correlation between the effective light source distribution and the line width difference in a pattern formed on a substrate by exposure;

DESCRIPTION OF THE EMBODIMENTS

Figure 1:
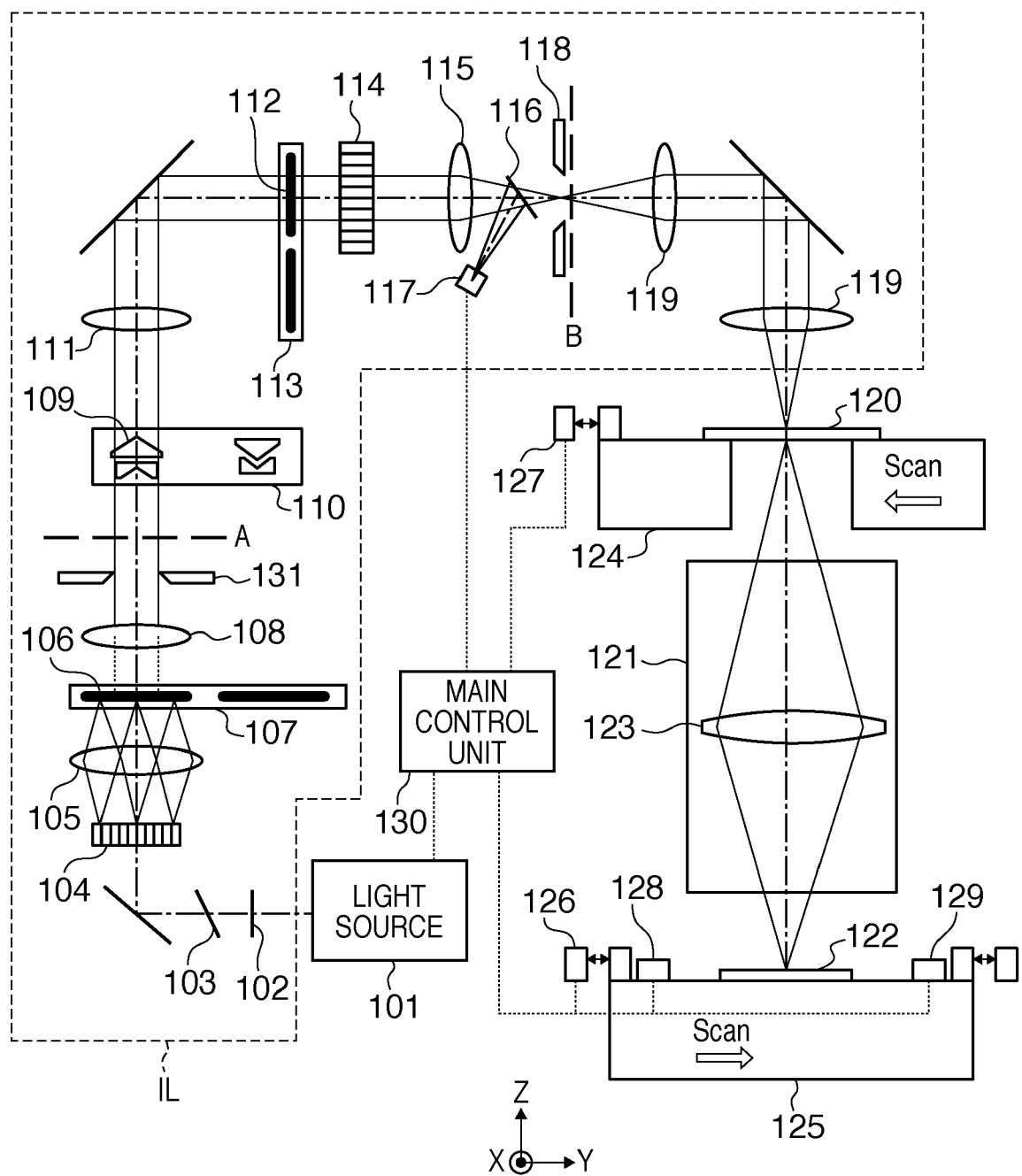
FIG. 1 is a view showing the schematic arrangement of an exposure apparatus according to an embodiment of the present invention.

An exposure apparatus EX according to an embodiment of the present invention will be explained with reference to FIG. 1. Although the exposure apparatus EX shown in FIG. 1 is a step & scan exposure apparatus (scanner), the exposure apparatus according to the present invention is not limited to this, and may be, for example, a stepper. The exposure apparatus EX includes a light source 101, an illumination optical system IL, an original driving mechanism 124 which holds and drives an original 120, a projection optical system 121, and a substrate driving mechanism 125 which holds and drives a substrate 122.

The light source 101 is, for example, a pulsed laser light source. For example, an ArF pulsed laser light source emits light with a wavelength of 193 nm. The pulsed laser light source can include, for example, a front mirror that serves as a resonator, a narrow-band module which narrows the wavelength range of light, a monitor module which monitors the wavelength stability and the spectral width, and a shutter. A main control unit (control unit) 130 can control, for example, the gas exchange operation, wavelength stabilization operation, and discharge voltage of the pulsed laser light source.

The illumination optical system IL can include, for example, optical components 102 to 119. A λ/2 plate 102 is made of a birefringent glass material such as rock crystal or magnesium fluoride, and converts a light beam supplied from the light source 101 into polarized light with its electric field vector pointing in a predetermined direction. A neutral density filter 103 is used to adjust the light intensity in accordance with the target exposure dose. A microlens array 104 outputs light with a specific angular distribution so as to prevent the characteristics of the light which enters an optical system downstream of the microlens array 104 even when a light beam supplied from the light source 101 shifts from the optical axis of the illumination optical system IL due to vibration of the floor or exposure apparatus.

A first condenser lens 105 guides the light from the microlens array 104 to a diffraction optical element 106. A turret 107 mounts a plurality of diffraction optical elements 106. An arbitrary diffraction optical element 106 can be inserted on the optical axis by rotating the turret 107 by an actuator. The light emerging from the diffraction optical element 106 is converged by a second condenser lens 108 and forms a diffraction pattern on a diffraction pattern surface A. The diffraction pattern can be changed by changing the diffraction optical element 106 to be inserted on the optical axis by rotating the turret 107.

The diffraction pattern formed on the diffraction pattern surface A has its parameters, describing the characteristics of the effective light source distribution of the illumination light, such as its annular zone ratio and σ value adjusted by a prism optical system 109 and first zoom lens 111. A turret 110 mounts a plurality of prism optical systems 109 which determine the shape of the effective light source distribution. An arbitrary prism optical system 109 can be inserted on the optical axis by rotating the turret 110 by an actuator. The σ value means herein the value of the ratio of the numerical aperture of the illumination optical system IL (the diameter of the effective light source distribution) to that of the projection optical system 121. The diameter of the effective light source distribution can be changed by controlling the first zoom lens 111. This makes it possible to set the σ value to a target value.

Figure 3A:
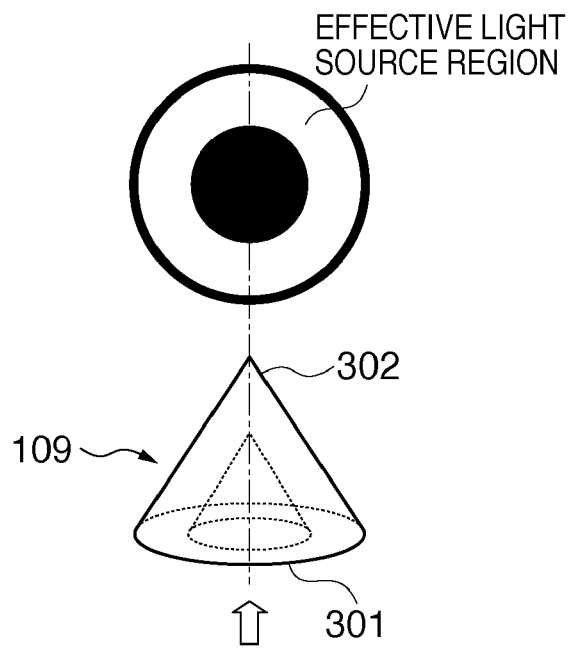
FIGS. 3A to 3D are views showing methods of forming effective light source distributions.
Figure 3B:
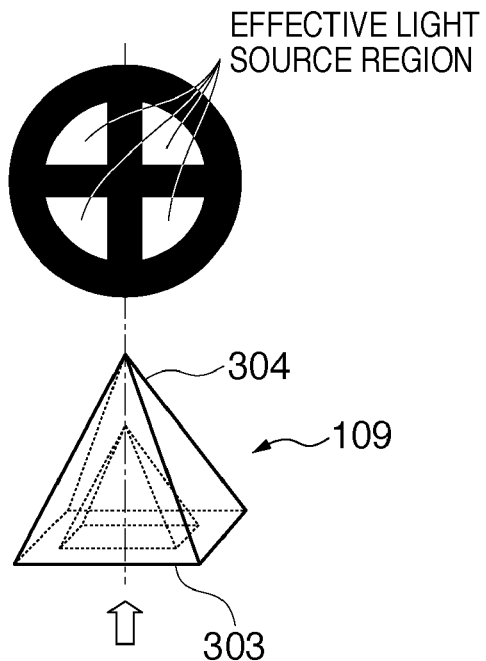
Figure 3C:
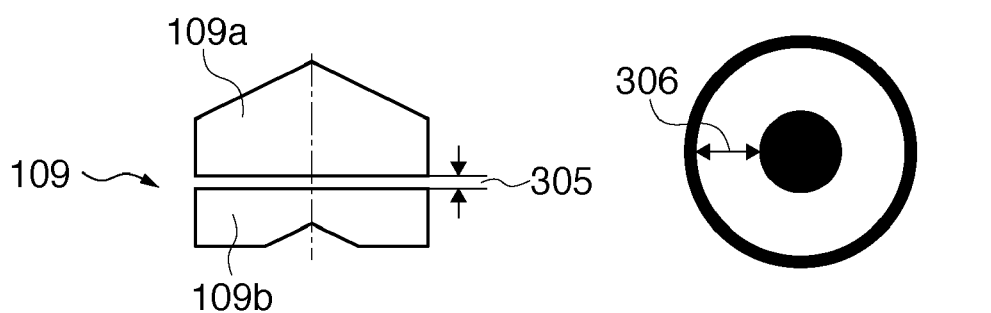
Figure 3D:
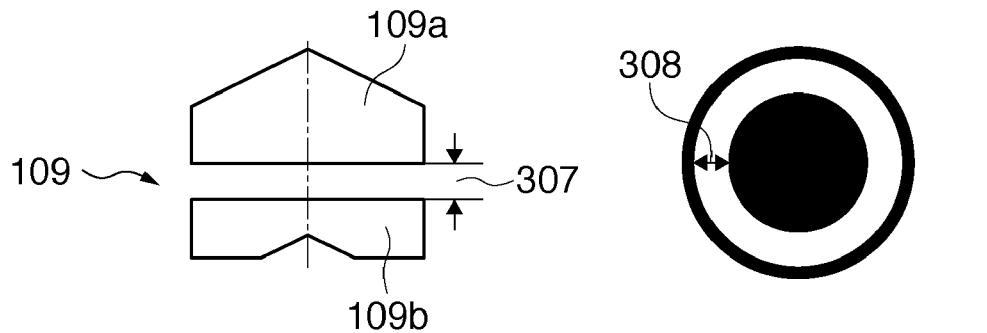

FIGS. 3A to 3D schematically show methods of controlling the effective light source distributions by the prism optical systems 109. FIG. 3A illustrates a method for forming an annular effective light source distribution. An annular effective light source distribution is formed by a prism optical system 109 having a concave conical surface (or a flat surface) 301 on the light incident side and a convex conical surface 302 on the light exit side. FIG. 3B illustrates a method for forming a quadrupole effective light source distribution. A quadrupole effective light source distribution is formed by a prism optical system 109 having a concave quadrangular pyramidal surface (or a flat surface) 303 on the light incident side and a convex quadrangular pyramidal surface 304 on the light exit side. FIGS. 3C and 3D illustrate a case in which the prism optical system 109 includes a pair of prisms 109a and 109b and the interval between the prisms 109a and 109b is adjusted. Various kinds of effective light source distributions can be formed by adjusting the interval between the prisms 109a and 109b. FIGS. 3C and 3D illustrate an example of the arrangement of a prism optical system 109 which forms an annular effective light source distribution. If the prisms 109a and 109b have a small interval 305 between them, as shown in FIG. 3C, an annular effective light source distribution having an effective light source region with a wide width 306 is formed. If the prisms 109a and 109b have a large interval 307 between them, as shown in FIG. 3D, an annular effective light source distribution having an effective light source region with a narrow width 308 is formed. Note that the effective light source region means a region where the light intensity is higher than a reference value in the effective light source distribution.

Referring back to FIG. 1, the diffraction pattern formed on the diffraction pattern surface A is enlarged or reduced by the first zoom lens 111 while holding nearly similar figures, thereby adjusting the σ value of the effective light source distribution. The light beam having passed through the first zoom lens 111 has its polarization state changed by a polarization optical element 112, and forms an image on the incident surface of a fly-eye lens 114. A second zoom lens 115 superposes the light beams divided by wavefront splitting by the fly-eye lens 114 to form a uniform light distribution on a plane B. A half mirror 116 in the optical path extracts a certain component of the light beam that illuminates the original 120, and splits it toward a light quantity detector 117. A relay optical system 119 projects the uniform light distribution formed on the plane B onto the original 120.

A pattern to be transferred onto the substrate 122 is formed on the original 120. A variable blind 118 includes a light-shielding plate driven in a plane perpendicular to the optical axis, and defines the illumination region in the pattern region on the original 120. FIG. 2 schematically shows a method for illuminating the original 120. The original 120 is driven by the original driving mechanism 124 so that a pattern region 202 on the original 120 wholly cuts across an illumination region formed by a slit-like light beam 203. The pattern of the original 120 is reduced and projected onto a substrate, coated with a photosensitive material (photoresist), at a reduction magnification β (β is, for example, ¼) by the projection optical system 121. At this time, the original 120 and substrate 122 are driven in opposite directions at a speed ratio equal to the reduction magnification β of the projection optical system 121 with respect to the projection optical system 121 and slit-like light beam 203, as indicated by an arrow (Scan) in FIG. 1. With this operation, the entire pattern formed in the pattern region 202 on the original 120 is transferred onto the substrate 122.

The light quantity detector 117 generates a signal corresponding to the intensity (exposure energy) of the light that illuminates the original 120. The signal output from the light quantity detector 117 is converted into exposure energy per pulse by an integrating circuit (not shown) that integrates the light quantity for each pulse emission of the light source 101, and is supplied to the main control unit 130. The main control unit 130 controls the exposure dose on the substrate 122 by feedback-controlling the quantity of light emitted by the light source 101 while monitoring the exposure dose using the light quantity detector 117 to match an appropriate exposure dose determined in accordance with the photosensitive material applied on the substrate 122.

An aperture stop (not shown) having a circular aperture is located on the pupil plane of the projection optical system 121 (the Fourier transform plane of the object plane on which the original 120 is placed). The diameter of the aperture can be set to a target value by a driving mechanism including, for example, a motor. The projection optical system 121 includes an optical element 123 that adjusts, for example, the aberration and projection magnification of the projection optical system 121. The position, orientation, and shape of the optical element 123 can be controlled using, for example, an air pressure or a piezoelectric element.

The substrate driving mechanism 125 includes a substrate stage that allows six-axis control. The position and orientation of the substrate stage are measured by a laser interferometer 126. The substrate stage includes a substrate chuck that holds the substrate 122. The main control unit 130 feedback-controls the position and orientation of the substrate stage based on the measurement results obtained by the laser interferometer 126. After the original 120 and substrate 122 are respectively positioned at predetermined positions, the main control unit 130 synchronously controls the light source 101, substrate driving mechanism 125, and original driving mechanism 124 to transfer the pattern of the original 120 in the pattern region 202 to a shot region on the substrate 122. Subsequently, the pattern of the original 120 in the pattern region 202 is transferred to the next shot region. With this operation, the pattern of the original 120 is transferred to all shot regions.

The substrate stage of the substrate driving mechanism 125 mounts an illuminance detector 128. The illuminance detector 128 is configured to detect the illuminance on the surface of the substrate 122 or the image plane of the projection optical system 121. The illuminance detector 128 includes, for example, a light-shielding member having a pinhole with a diameter of several hundreds of micrometers, and a photodiode that detects the light having passed through the pinhole. The illuminance detector 128 detects the illuminance on the image plane in this case.

Figure 4A:
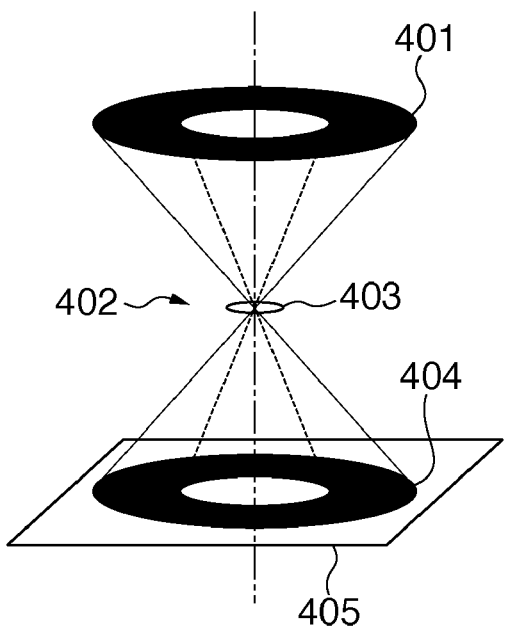
FIGS. 4A and 4B are views showing the principle and schematic arrangement of a measurement device which measures an effective light source.
Figure 4B:
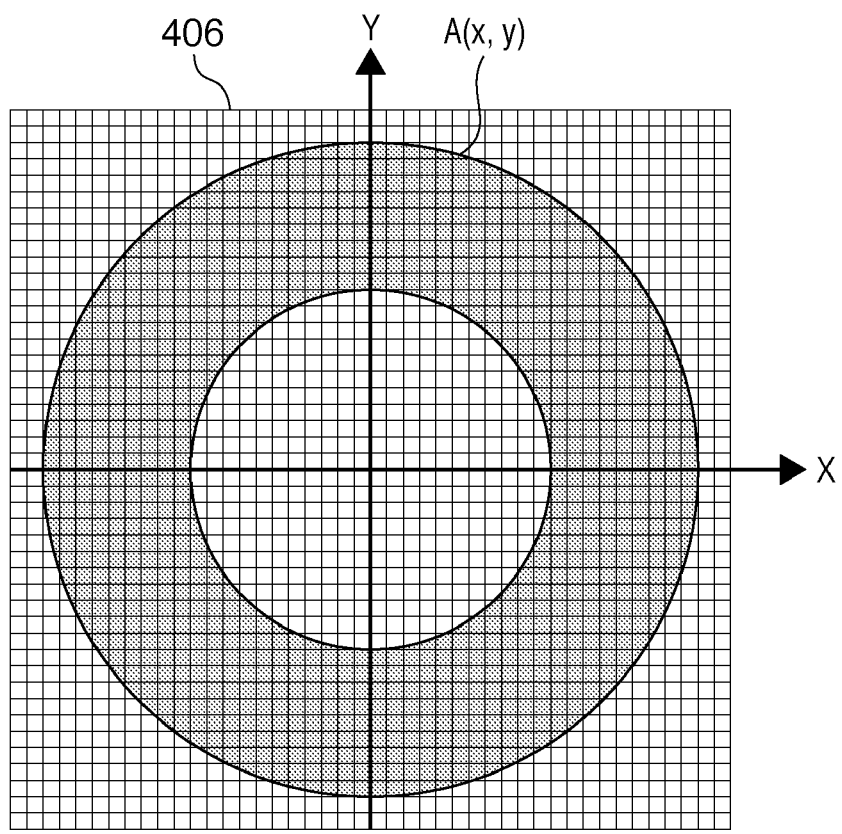

The substrate stage of the substrate driving mechanism 125 mounts a measurement device 129 that measures an effective light source distribution. The principle and arrangement of the measurement device 129 will be explained with reference to FIGS. 4A and 4B. As shown in FIG. 4A, the measurement device 129 includes, for example, a light-shielding member having a pinhole 403, and an image sensor (for example, a CCD sensor) 405 which senses an image formed by the light having passed through the pinhole 403. The light-shielding member having the pinhole 403 is located on an image plane 402 of the projection optical system 121, and the pinhole 403 has a diameter of, for example, several tens of micrometers. An image formed on the image sensing surface of the image sensor 405 by the light having passed through the pinhole 403 bears the information of the angular distribution of the light guided to the image plane. This angular distribution is equivalent in design to a light intensity distribution formed on the pupil plane of the projection optical system (illumination optical system). These distributions will be referred to as the effective light source distributions hereinafter. The measurement device 129 is used to obtain information concerning these effective light source distributions. FIG. 4B schematically shows an effective light source distribution sensed by the image sensor 405. Each element that constitutes a grid pattern is a pixel of the image sensor 405. The position of a pixel is represented by coordinates (x,y), and the value of the pixel located at the coordinates (x,y) is represented by a light intensity A(x,y). The line width of a pattern formed on a substrate can be controlled with high accuracy by measuring the effective light source distribution and adjusting it to match a target effective light source distribution in calibration before the substrate is exposed.

However, even if the effective light source distribution is adjusted to match a target effective light source distribution, a line width difference may occur in a pattern actually formed on a substrate due to, for example, process factors other than those associated with the exposure apparatus or manufacturing errors of a pattern formed on the original. The line width difference means herein the difference in line width between a pattern formed on a substrate to extend in the X direction (first direction) and a pattern formed to extend in the Y direction (second direction) on the substrate. The line width difference preferably is zero or falls within a tolerance. Nevertheless, in a special application example, the effective light source distribution may desirably be adjusted to obtain an arbitrary line width difference other than zero.

A method for controlling the line width difference by adjusting the effective light source distribution will be explained below. The illumination optical system IL includes an adjusting mechanism 131 which adjusts the effective light source distribution. The adjusting mechanism 131 can include, for example, a plurality of light-shielding plates. Referring to FIGS. 5A to 5C, a, e, and i schematically show adjusting mechanisms 131 and effective light source distributions 506. In a, e, and i, the optical axis of the illumination optical system is defined as the Z-axis, and a plane perpendicular to the Z-axis is defined as the X-Y plane. Although a, e, and i each show the effective light source distribution as if a part of it were removed by the light-shielding plates, the adjusting mechanism 131 controls the intensity (energy) of the light beam while it holds an annular shape on the surface A, shown in FIG. 1, in practice.

The adjusting mechanism 131 includes light-shielding plates XR, XL, YU, and YD and actuators which individually drive them. The actuators operate in accordance with commands from the main control unit 130. Referring to FIG. 5A, a shows the state in which the effective light source distribution is influenced by the light-shielding plates XR, XL, YU, and YD. b shows a distribution 507, in the X-axis (first direction), of the effective light source distribution in the state shown in a, and c shows a distribution 508, in the Y-axis (second direction), of the effective light source distribution in the state shown in a. In b and c, the abscissa indicates the position with reference to the optical axis, and the ordinate indicates the light intensity. In this example, in the state shown in a, the distribution, in the X-axis (first direction), of the effective light source distribution is equal to that in the Y-axis (second direction) of the effective light source distribution.

Referring to FIG. 5B, e shows the state in which the light intensity in the distribution, in the X-axis (first direction), of the effective light source distribution has decreased by moving, to/from the optical axis direction, the light-shielding plates XR and XL which can move in the X direction. f shows a distribution 510, in the X-axis (first direction), of the effective light source distribution in the state shown in e. The distribution 510 has a light intensity lower than that in the distribution 507. g shows a distribution 511, in the Y-axis (second direction), of the effective light source distribution in the state shown in e. The distribution 511 has the same light intensity as that in the distribution 508.

Referring to FIG. 5C, i shows the state in which the light intensity in the distribution, in the Y direction (second direction), of the effective light source distribution has decreased by moving, to/from the optical axis direction, the light-shielding plates YU and YD which can move in the Y direction. j shows a distribution 513, in the X-axis (first direction), of the effective light source distribution in the state shown in i. The distribution 513 has the same light intensity as that in the distribution 507. k shows a distribution 514, in the Y direction (second direction), of the effective light source distribution in the state shown in i. The distribution 514 has a light intensity lower than that in the distribution 508.

Referring to FIG. 5A, d shows a pattern (a latent image pattern or a physical pattern obtained by developing it) formed by exposing the substrate 122 in the state shown in a. Referring to FIG. 5B, h shows a pattern formed by exposing the substrate 122 in the state shown in e. Referring to FIG. 5D, l shows a pattern formed by exposing the substrate 122 in the state shown in i. In d, the line width (the width in the Y direction) of a pattern 515 extending in the X direction (first direction) is equal to that (the width in the X direction) of a pattern 516 extending in the Y direction (second direction) (the line width difference is zero). In h, the line width of a pattern 517 extending in the X direction (first direction) is narrower than that of a pattern 518 extending in the Y direction (second direction) due to a decrease in light intensity of the effective light source distribution in the X direction (first direction), so a line width difference occurs. In l, the line width of a pattern 520 extending in the Y direction (second direction) is narrower than that of a pattern 519 extending in the X direction (first direction) due to a decrease in light intensity of the effective light source distribution in the Y direction (second direction), so a line width difference occurs. As described above, the line width difference in a pattern formed on a substrate can be controlled by adjusting the effective light source distribution by the adjusting mechanism 131.

Figure 6:
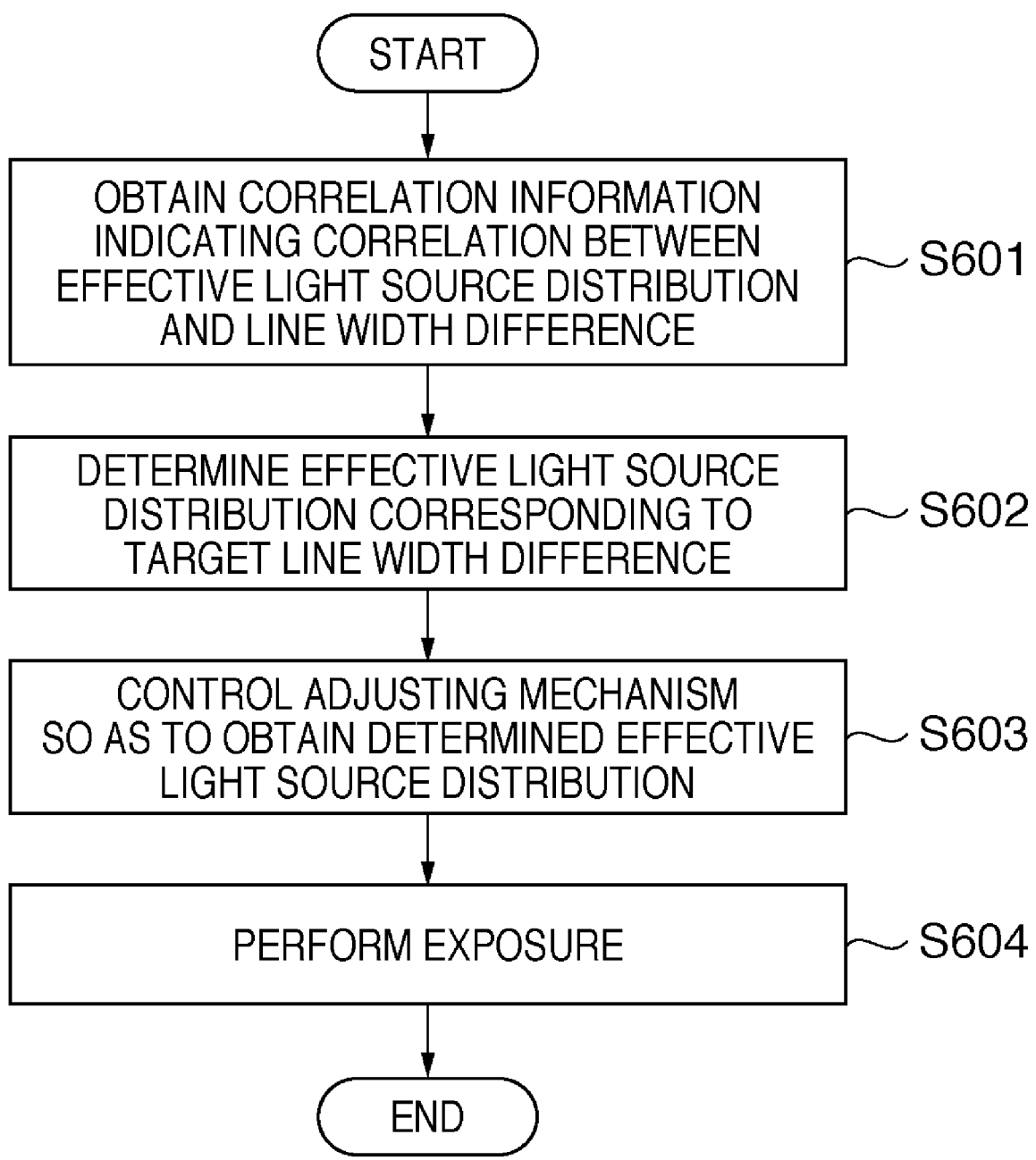
FIG. 6 is a flowchart showing an exposure method according to the embodiment of the present invention.

An exposure method according to the embodiment of the present invention will be explained with reference to FIG. 6. The main control unit (control unit) 130 can control this exposure method. In step S601 (obtaining step), the main control unit 130 obtains, via an interface (input device; not shown), correlation information indicating a correlation between the effective light source distribution and the line width difference in a pattern formed on a substrate by exposure. The line width difference means herein the difference in line width between a pattern extending in the X direction (first direction) within the substrate plane and a pattern extending in the Y direction (second direction) perpendicular to the X direction within the substrate plane. The light intensity distribution having the correlation can be specified by the ratio (the X/Y light quantity ratio in the following example) between an index value to evaluate the light intensity distribution in the X direction and that to evaluate the light intensity distribution in the Y direction.

In step S602 (determining step), the main control unit 130 determines an effective light source distribution corresponding to a target line width difference based on the correlation information. The target line width difference mentioned herein is typically zero or a value that falls within a tolerance, but can be an arbitrary value in a special application example.

In step S603 (controlling step), the main control unit 130 controls the adjusting mechanism 131 to obtain the effective light source distribution determined in step S602. A detailed example of the operation in step S603 will be described later with reference to FIG. 8. In the foregoing way, an effective light source distribution which can form a pattern on the substrate with a line width difference corresponding to a target line width difference is set. In step S604, the main control unit 130 exposes the substrate with the set effective light source distribution.

A method for generating correlation information indicating a correlation between the effective light source distribution and the line width difference in a pattern formed on a substrate by exposure will be explained with reference to FIGS. 7A and 7B. In one detailed example, the light intensity distribution having the correlation is specified by the X/Y light quantity ratio that exemplifies the ratio between an index value to evaluate the light intensity distribution in the X direction and that to evaluate the light intensity distribution in the Y direction.

Figure 7A:
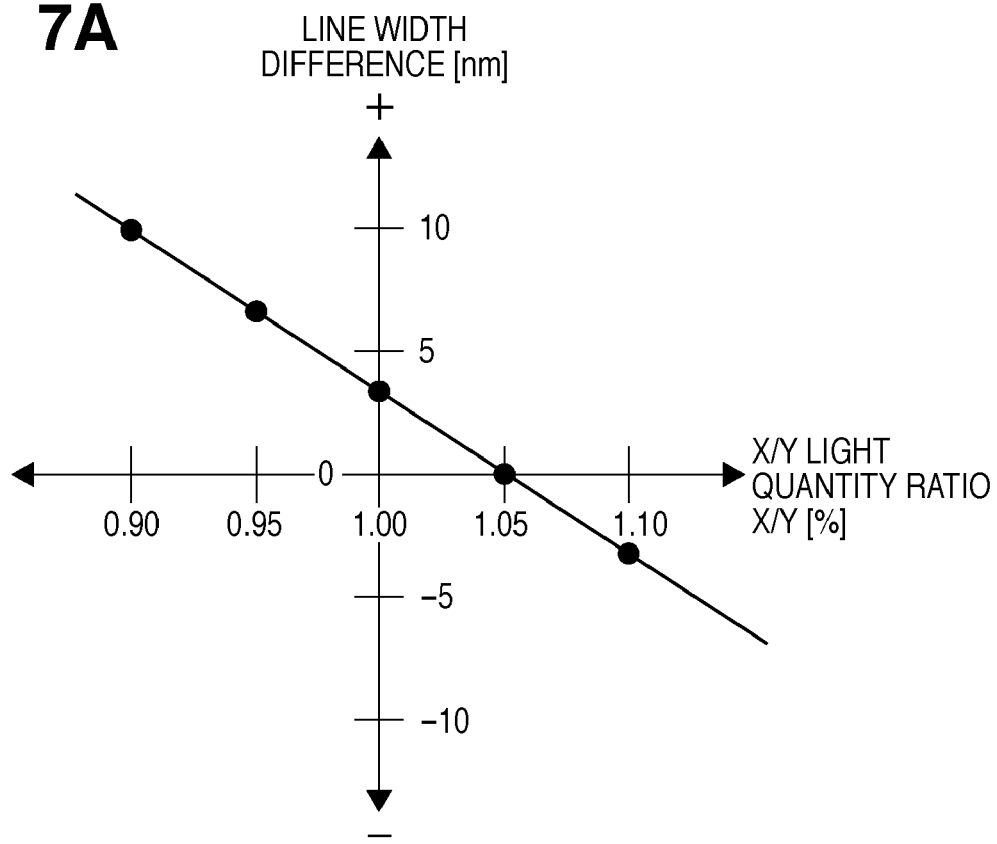
FIGS. 7A and 7B are graphs showing a method for generating correlation information.
Figure 7B:
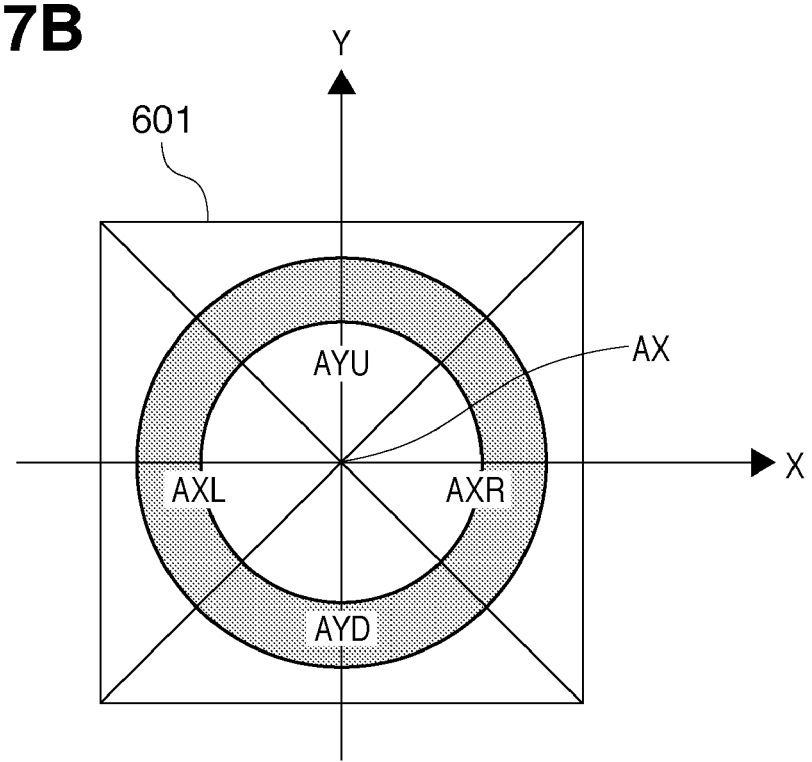

FIG. 7A illustrates correlation information. The correlation information may be represented by, for example, a mathematical expression, a table, or another form. The ordinate in FIG. 7A indicates the line width difference in a pattern (a latent image pattern or a physical pattern obtained by developing it) formed on a substrate. The line width difference means herein the difference in line width between a pattern extending in the X direction (first direction) and a pattern extending in the Y direction (second direction). The abscissa in FIG. 7A indicates the X/Y light quantity ratio. The X/Y light quantity ratio can be measured using the measurement device 129. FIG. 7B illustrates an effective light source distribution 601 measured using the measurement device 129. The effective light source distribution 601 has an annular effective light source region in this example.

In this example, divided regions AXL, AXR, AYU, and AYD obtained by dividing the region sensed by the measurement device 129 into four regions using two straight lines which pass through the origin and form ±45° with the X-axis in an X-Y coordinate system are defined. The integrated light quantities in the divided regions AXL, AXR, AYU, and AYD are calculated as an AXL light quantity, AXR light quantity, AYU light quantity, and AYD light quantity, respectively. Based on the AXL light quantity, AXR light quantity, AYU light quantity, and AYD light quantity, the X/Y light quantity ratio is calculated in accordance with:

$$X/Y \text{ Light Quantity Ratio} = ((AXL \text{ Light Quantity}) + (AXR \text{ Light Quantity}))/((AYU \text{ light quantity}) + (AYD \text{ Light Quantity})) \quad (1)$$

where ((AXL Light Quantity)+(AXR Light Quantity)) is an index value to evaluate the effective light source distribution in the X direction (first direction), and ((AYU Light Quantity)+(AYD Light Quantity)) is an index value to evaluate the effective light source distribution in the Y direction (second direction).

Correlation information can be obtained by, for example, performing test exposure of substrates with a plurality of effective light source distributions, measuring patterns formed on the substrates, measuring the respective effective light source distributions by the measurement device 129, and calculating the X/Y light quantity ratios based on the measurement results. Alternatively, correlation information may be obtained by simulation if sufficient accuracy can be ensured. A plurality of effective light source distributions can be formed by changing a setting value input to the adjusting mechanism 131. Pieces of correlation information may be provided for individual originals or individual processes (for example, the type of a photosensitive material, a coating device, or a developing device). If pieces of correlation information are provided for individual originals, it is possible to reduce a line width difference that occurs in the pattern on the substrate due to drawing errors of the patterns of the individual originals. If pieces of correlation information are provided for individual processes, it is possible to reduce a line width difference that occurs in the pattern on the substrate due to factors associated with the individual processes.

A case in which the main control unit 130 obtains the correlation information shown in FIG. 7A in step S601 and determines an effective light source distribution corresponding to a target line width difference assuming the target line width difference as zero in step S602 will be considered herein as one example. In this case, "1.05" that is an X/Y light quantity ratio at which the line width difference is zero in FIG. 7A is determined as a value to specify the effective light source distribution. In this case, in step S603, the adjusting mechanism 131 performs control or setting so as to obtain an effective light source distribution with an X/Y light quantity ratio of "1.05".

Figure 8:
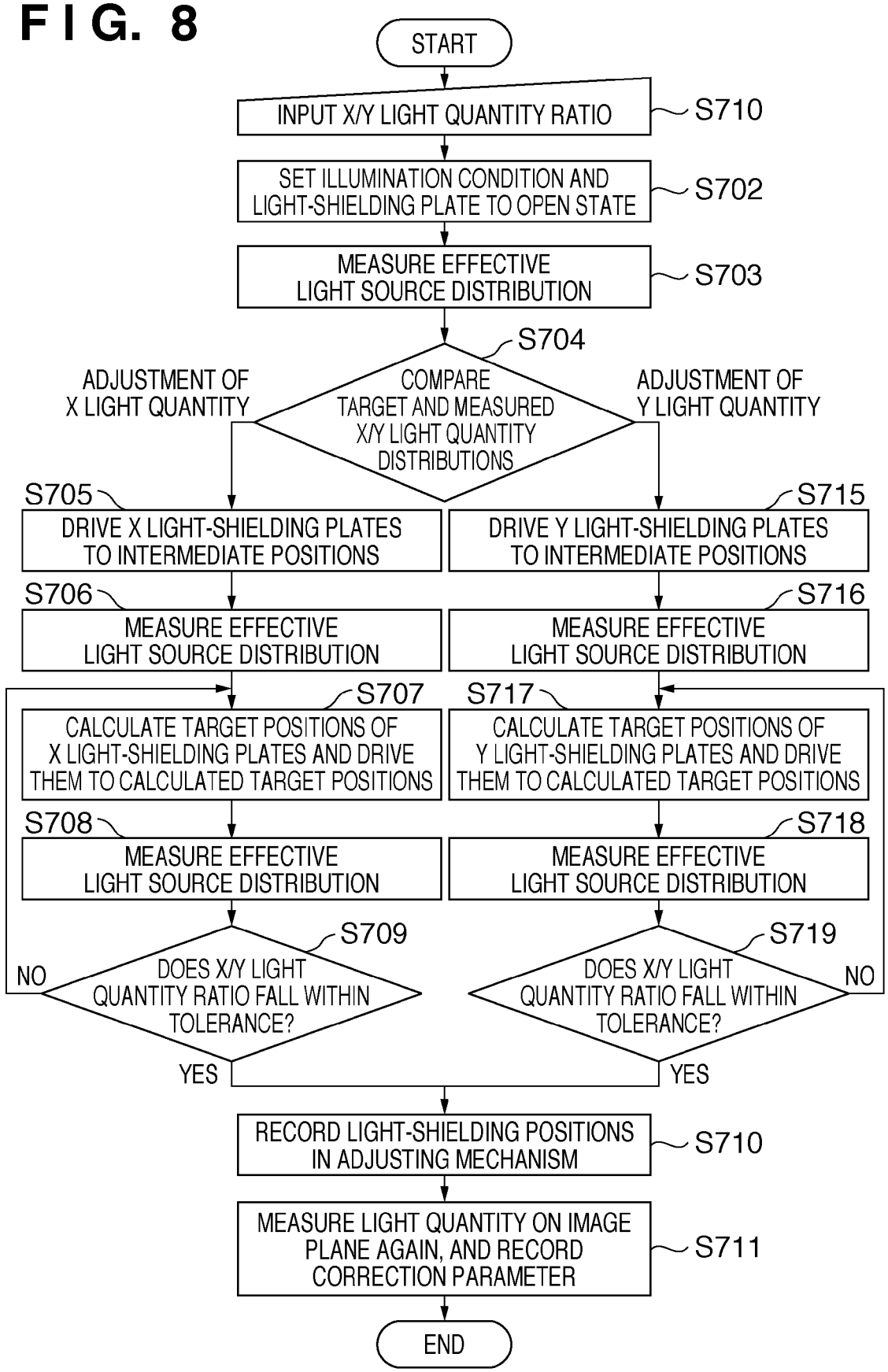
FIG. 8 is a flowchart showing a method for adjusting the effective light source distribution.
Figure 9A:
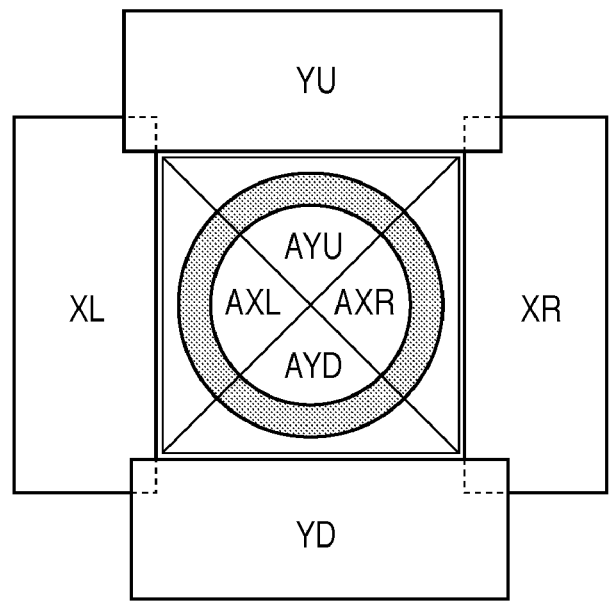
FIGS. 9A and 9B are views illustrating the positions of light-shielding plates of an adjusting mechanism.

A detailed example of the operation in step S603 will be explained below with reference to FIG. 8. First, in step S701, the main control unit 130 inputs, as a target X/Y light quantity ratio, the X/Y light quantity ratio determined as a value to specify the effective light source distribution in step S602. In step S702, the main control unit 130 sets the original illumination condition for substrate exposure. When, for example, the original is illuminated with an annular effective light source distribution, the main control unit 130 adjusts the first zoom lens 111 so as to obtain the designated σ value, and adjusts the interval of the pair of prisms 109a and 109b of the prism optical system 109 so as to obtain the designated annular zone width. In setting the illumination condition, the light-shielding plates XR, XL, YU, and YD of the adjusting mechanism 131 are retracted to positions where they do not shield the light (i.e., the light-shielding plates XR, XL, YU, and YD are set to an open state), as shown in FIG. 9A.

In step S703, the main control unit 130 measures the X/Y light quantity ratio. More specifically, the main control unit 130 causes the measurement device 129 to measure the effective light source distribution and calculates the X/Y light quantity ratio in accordance with equation (1) based on the measurement result. In step S704, the main control unit 130 compares the target X/Y light quantity ratio input in step S701 and the X/Y light quantity ratio measured in step S703. If the target X/Y light quantity ratio is lower than the measured X/Y light quantity ratio, the main control unit 130 advances the process to step S705. On the other hand, if the target X/Y light quantity ratio is higher than the measured X/Y light quantity ratio, the main control unit 130 advances the process to step S715. Note that the processes in steps S705 to S709 and those in steps S715 to S719 are the same except for the light-shielding plates to be controlled, and a description of the processes in steps S715 to S719 will not be given.

Figure 9B:
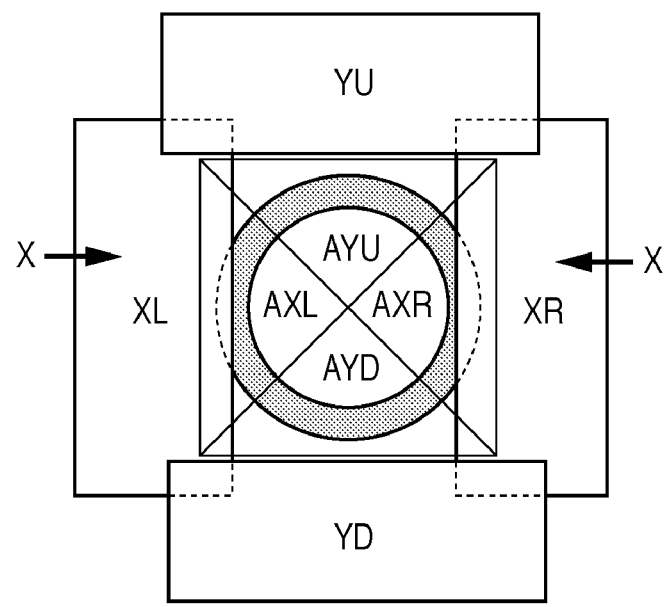

In step S705, the main control unit 130 causes the actuators to drive the light-shielding plates XL and XR to intermediate positions in the optical axis direction, as shown in FIG. 9B, measures the effective light source distribution again in step S706, and calculates the X/Y light quantity ratio.

In step S707, the main control unit 130 calculates the rate of change in X/Y light quantity ratio (sensitivity) for the amounts of movement of the light-shielding plates XL and XR based on the X/Y light quantity ratio measured when the light-shielding plates XL and XR are open and that measured when the light-shielding plates XL and XR are set at the intermediate positions. Then, the main control unit 130 calculates target positions of the light-shielding plates XL and XR, where the target X/Y light quantity ratio is obtained, and causes the actuators to drive the light-shielding plates XL and XR so that they are positioned at the calculated target positions.

In step S708, the main control unit 130 measures the effective light source distribution and calculates the X/Y light quantity ratio. In step S709, the main control unit 130 determines whether the current X/Y light quantity ratio of the effective light source distribution falls within the tolerance of the target X/Y light quantity ratio. If the X/Y light quantity ratio does not fall within the tolerance, the process returns to step S707. In this case, the main control unit 130 calculates the rate of change in X/Y light quantity ratio (sensitivity) again from the X/Y light quantity ratio measured previously and the information of the light-shielding positions, calculates target positions of the light-shielding plates XL and XR again, and causes the actuators to drive the light-shielding plates XL and XR so that they are positioned at the calculated target positions.

The main control unit 130 advances the process to step S710 when the X/Y light quantity ratio falls within the tolerance of the target X/Y light quantity ratio. In step S710, the main control unit 130 records a setting value (a value to set the positions of the light-shielding plates) for the adjusting mechanism 131 corresponding to the target X/Y light quantity ratio.

The exposure dose on the substrate changes upon adjusting the effective light source distribution by the light-shielding plates XR, XL, YU, and YD. Therefore, in step S711, the main control unit 130 determines and records a correction parameter in order to correct an error of the exposure dose. The correction parameter can be determined based on the detection value obtained by the illuminance detector 128 mounted on the substrate stage, and that obtained by the light quantity detector 117 inserted in the illumination optical system IL.

As described above, according to the embodiment of the present invention, the line width difference can be controlled to fall within the tolerance of a target line width difference by adjusting the effective light source shape representing a light intensity distribution formed on the pupil plane of the projection optical system.

A device manufacturing method according to an embodiment of the present invention can be employed to manufacture devices such as a semiconductor device and a liquid crystal device. The device manufacturing method can include a step of exposing a substrate coated with a photosensitive agent in accordance with the above-mentioned exposure method, and a step of developing the exposed substrate. The device manufacturing method can also include subsequent known steps (for example, oxidation, film formation, vapor deposition, doping, planarization, etching, resist removal, dicing, bonding, and packaging).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-097390, filed Apr. 13, 2009, which is hereby incorporated by reference herein in its entirety.

What is claimed is:

1. A method for exposing a substrate by an exposure apparatus comprising an illumination optical system which is configured to illuminate an original and includes an adjusting mechanism that adjusts an effective light source distribution, and a projection optical system which projects a pattern of the original illuminated by the illumination optical system onto a substrate, the method comprising the steps of:

obtaining correlation information indicating a correlation between an effective light source distribution and a line width difference in a pattern formed on a substrate by exposure;

determining a target effective light source distribution corresponding to a target line width difference based on the correlation information;

controlling the adjusting mechanism so as to obtain the target effective light source distribution determined in the determining step; and exposing the substrate after the controlling step, wherein the line width difference is a difference in line width between a pattern extending in a first direction within a plane of the substrate and a pattern extending in a second direction perpendicular to the first direction within the plane of the substrate, the adjusting mechanism adjusts a ratio between a light quantity of the effective light source distribution in the first direction and a light quantity of the effective light source distribution in the second direction so as to adjust the effective light source distribution, and the step of controlling includes the steps of:

obtaining a rate of change in the ratio to an amount of adjustment by the adjustment mechanism;

measuring the effective light source;

determining an amount of adjustment by the adjustment mechanism based on (a) a ratio between a light quantity of the measured effective light source distribution in the first direction and a light quantity of the measured effective light source distribution in the second direction, (b) a ratio between a light quantity of the target effective light source distribution in the first direction and a light quantity of the target effective light source distribution in the second direction, and (c) the rate of change; and causing the adjustment mechanism to adjust the ratio in accordance with the determined amount of adjustment.

2. The method according to claim 1, wherein
the effective light source distribution having the correlation is specified by the ratio,
the adjusting mechanism includes a mechanism which adjusts the effective light source distribution in the first direction, and a mechanism which adjusts the effective light source distribution in the second distribution,
in the determining step, a target ratio corresponding to the target line width difference is determined, and
in the controlling step, the adjusting mechanism is controlled so as to obtain the target ratio determined in the determining step.

3. The method according to claim 1, wherein
the exposure apparatus further comprises a measurement device which measures the effective light source distribution, and
in the controlling step, the adjusting mechanism is controlled while measuring the effective light source distribution using the measurement device.

4. The method according to claim 1, wherein
the adjusting mechanism includes a light-shielding plate which defines a shape of a light intensity distribution formed on a pupil plane of the projection optical system, and
in the controlling step, a position of the light-shielding plate is controlled.

5. An exposure apparatus comprising an illumination optical system which is configured to illuminate an original and includes an adjusting mechanism that adjusts an effective light source distribution, and a projection optical system which projects a pattern of the original illuminated by the illumination optical system onto a substrate to expose the substrate, the apparatus comprising a control unit configured to determine a target effective light source distribution corresponding to a target line width difference based on correlation information indicating a correlation between the effective light source distribution and a line width difference in a pattern formed on a substrate by exposure, and to control the adjusting mechanism so as to obtain the determined target effective light source distribution, and a measurement device which measures the effective light source distribution, wherein the line width difference is a difference in line width between a pattern extending in a first direction within a plane of the substrate and a pattern extending in a second direction perpendicular to the first direction within the plane of the substrate, the adjusting mechanism adjusts a ratio between a light quantity of the effective light source distribution in the first direction and a light quantity of the effective light source distribution in the second direction so as to adjust the effective light source distribution, and the control unit performs:
obtaining a rate of change in the ratio to an amount of adjustment by the adjustment mechanism;

determining an amount of adjustment by the adjustment mechanism based on (a) a ratio between a light quantity of the effective light source distribution in the first direction measured by the measurement unit and a light quantity of the effective light source distribution in the second direction measured by the measurement unit, (b) a ratio between a light quantity of the target effective light source distribution in the first direction and a light quantity of the target effective light source distribution in the second direction, and (c) the rate of change; and causing the adjustment mechanism to adjust the ratio in accordance with the determined amount of adjustment.

6. A device manufacturing method comprising the steps of:
adjusting an effective light source distribution of an exposure apparatus,
exposing a substrate using the adjusted exposure apparatus; and
developing the substrate,
the exposure apparatus comprising an illumination optical system which is configured to illuminate an original and includes an adjusting mechanism that adjusts an effective light source distribution, and a projection optical system which projects a pattern of the original illuminated by the illumination optical system onto a substrate,
the adjusting step comprising the steps of:
obtaining correlation information indicating a correlation between an effective light source distribution and a line width difference in a pattern formed on a substrate by exposure; and
determining a target effective light source distribution corresponding to a target line width difference based on the correlation information;
controlling the adjusting mechanism so as to obtain the target effective light source distribution determined in the determining step,
wherein the line width difference is a difference in line width between a pattern extending in a first direction within a plane of the substrate and a pattern extending in a second direction perpendicular to the first direction within the plane of the substrate,
the adjusting mechanism adjusts a ratio between a light quantity of the effective light source distribution in the first direction and a light quantity of the effective light source distribution in the second direction so as to adjust the effective light source distribution, and
the step of controlling includes the steps of:
obtaining a rate of change in the ratio to an amount of adjustment by the adjustment mechanism;
measuring the effective light source;
determining an amount of adjustment by the adjustment mechanism based on (a) a ratio between a light quantity of the measured effective light source distribution in the first direction and a light quantity of the measured effective light source distribution in the second direction, (b) a ratio between a light quantity of the target effective light source distribution in the first direction and a light quantity of the target effective light source distribution in the second direction, and (c) the rate of change; and causing the adjustment mechanism to adjust the ratio in accordance with the determined amount of adjustment.

7. The method according to claim 1, wherein the adjustment mechanism includes a light-shielding plate and an actuator that moves the light-shielding plate, and the rate of change in the ratio is obtained by causing the actuator to move the light-shielding plate.

8. The method according to claim 1, wherein the step of controlling further includes repeating the steps of obtaining, measuring, determining and causing when the effective light source distribution does not fall within a tolerance of the target effective light source distribution after the step of causing.

9. The method according to claim 1, wherein the adjustment mechanism includes a light-shielding plate and an actuator that moves the light-shielding plate for adjusting the rate of change in the ratio, the step of obtaining including obtaining the rate based on
(a) a ratio between a light quantity of the effective light source distribution measured by the measurement device before moving the light-shielding plate by the actuator and a light quantity of the effective light source distribution measured by the measurement device after moving the light-shielding plate by the actuator, and (b) an amount of moving of the light shielding plate by the actuator.

* * * * *